(12) United States Patent
Chen

(10) Patent No.: US 9,041,166 B2
(45) Date of Patent: *May 26, 2015

(54) MANUFACTURING METHOD OF CIRCUIT STRUCTURE

(71) Applicant: Subtron Technology Co., Ltd., Hsinchu County (TW)

(72) Inventor: Ching-Sheng Chen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/304,988

(22) Filed: Jun. 16, 2014

(65) Prior Publication Data

US 2014/0295353 A1    Oct. 2, 2014

Related U.S. Application Data

(60) Division of application No. 13/371,459, filed on Feb. 12, 2012, now Pat. No. 8,803,295, which is a continuation-in-part of application No. 13/160,501, filed on Jun. 14, 2011, now Pat. No. 8,552,303.

(30) Foreign Application Priority Data

May 4, 2011 (TW) .............................. 100115619 A
Dec. 21, 2011 (TW) .............................. 100147742 A

(51) Int. Cl.
H01L 21/00 (2006.01)
H05K 3/28 (2006.01)
H05K 3/06 (2006.01)

(52) U.S. Cl.
CPC .................. *H05K 3/28* (2013.01); *H05K 3/062* (2013.01); *H05K 2201/0338* (2013.01)

(58) Field of Classification Search
CPC .. H05K 3/28; H05K 3/062; H05K 2201/0338
USPC .................................................. 438/687, 790
See application file for complete search history.

(56) References Cited

U.S. PATENT DOCUMENTS 8,552,303 B2 * 10/2013 Chen .............................. 174/257
8,803,295 B2 *  8/2014 Chen .............................. 257/632

* cited by examiner

*Primary Examiner* — Richard Booth
(74) *Attorney, Agent, or Firm* — Jianq Chyun IP Office

(57) ABSTRACT

A manufacturing method of a circuit structure is provided. A metal layer having an upper surface is provided. A surface passivation layer is formed on the metal layer. The surface passivation layer exposes a portion of the upper surface of the metal layer, and a material of the metal layer is different from a material of the surface passivation layer. A covering layer is formed on the surface passivation layer, and the covering layer covers the surface passivation layer.

6 Claims, 4 Drawing Sheets

MANUFACTURING METHOD OF CIRCUIT STRUCTURE

CROSS-REFERENCE TO RELATED APPLICATION

This application is a divisional application of and claims the priority benefit of a prior application Ser. No. 13/371,459, filed on Feb. 12, 2012, which claims the priority benefits of Taiwan application serial no. 100147742, filed on Dec. 21, 2011. The prior application Ser. No. 13/371,459 is also a continuation-in-part application of and claims the priority benefit of a prior application Ser. No. 13/160,501, filed on Jun. 14, 2011, now U.S. Pat. No. 8,552,303. The prior application Ser. No. 13/160,501 claims the priority benefits of Taiwan application serial no. 100115619, filed on May 4, 2011. The entirety of each of the above-mentioned patent applications is hereby incorporated by reference herein and made a part of this specification.

BACKGROUND OF THE DISCLOSURE

1. Field of the Invention

The invention relates to a circuit structure and a manufacturing method thereof. More particularly, the invention relates to a circuit structure capable of preventing Galvanic effects from occurring in an etching process or in any process that can lead to electrochemical reaction and a manufacturing method of the circuit structure.

2. Description of the Related Art

Circuit boards applied in the existing semiconductor package process have advantages of closed wiring, compact assembly, and favorable performance, the circuit boards have become one of the most applicable package devices. A circuit board can be assembled to a plurality of electronic components, e.g., chips, passive components, and so forth. The electronic components can be electrically connected by the circuit board, and thereby signals can be transmitted among the electronic components.

In most cases, the circuit board is formed by alternately stacking a plurality of patterned circuit layers and a plurality of dielectric layers. The patterned circuit layers are electrically connected through conductive blind holes or conductive vias. Here, the patterned circuit layers are mostly made of copper or copper alloy. Hence, in order to slow down or even preclude oxidation, a nickel gold layer, a nickel silver layer, or a nickel palladium gold layer that can act as a surface passivation layer is often formed on the outermost patterned circuit layer. Based on actual requirements, subsequent processes on the circuit board may be required. Since the patterned circuit layers made of copper or copper alloy and the noble metal (e.g., the gold layer or the silver layer) have different redox potential, when a wet etching process or a wet micro-etching process is subsequently performed, the patterned circuit layers serve as the anode, and the noble metal (e.g., the gold layer or the silver layer) serves as the cathode. This results in the well-known Galvanic cell effect. The patterned circuit layers made of copper or copper alloy are thus etched or dissolved in an accelerated manner. Thereby, the etching rate cannot be well managed for producing favorable etching result. Moreover, due to the expedited dissolution of the copper or the copper alloy, the copper or the copper alloy may not have the required thickness, such that the electrical quality of the circuit board may be deteriorated.

SUMMARY OF THE INVENTION

The invention is directed to a circuit structure and a manufacturing method thereof for preventing Galvanic effects from occurring in a subsequent etching process or in any process that can lead to electrochemical reaction.

In an embodiment of the invention, a manufacturing method of a circuit structure is provided. The manufacturing method includes following steps. A metal layer having an upper surface is provided. A surface passivation layer is formed on the metal layer. The surface passivation layer exposes a portion of the upper surface of the metal layer, and a material of the metal layer is different from a material of the surface passivation layer. A covering layer is formed on the surface passivation layer, and the covering layer covers the surface passivation layer.

According to an embodiment of the invention, the step of forming the covering layer includes dipping the metal layer and the surface passivation layer into a modifier. Here, the modifier is selectively attached to the surface passivation layer through absorption, so as to form the covering layer that covers a portion of the surface passivation layer.

According to an embodiment of the invention, a material of the covering layer includes an organic material.

According to an embodiment of the invention, the organic material includes mercaptan nano-polymer or hydroxypropyl-beta-cyclodextrin.

According to an embodiment of the invention, the step of forming the covering layer includes forming a covering material layer on the surface passivation layer and the portion of the upper surface of the metal layer exposed by the surface passivation layer, providing a photomask on the covering material layer, performing an exposure process and a development process on the covering material layer through the photomask, so as to form the covering layer, and removing the photomask. Here, the photomask is disposed corresponding to the surface passivation layer.

According to an embodiment of the invention, a material of the covering material layer includes a photoresist material.

According to an embodiment of the invention, the photoresist material includes dry film photoresist or liquid photoresist.

According to an embodiment of the invention, a material of the metal layer includes copper or copper alloy.

According to an embodiment of the invention, the surface passivation layer includes a nickel layer and a gold layer. The nickel layer is located between the metal layer and the gold layer, and the gold layer covers the nickel layer.

According to an embodiment of the invention, the surface passivation layer includes a nickel layer, a palladium layer, and a gold layer. The nickel layer is located between the metal layer and the palladium layer, and the gold layer covers the palladium layer.

According to an embodiment of the invention, the surface passivation layer includes a nickel layer and a silver layer. The nickel layer is located between the metal layer and the silver layer, and the silver layer covers the nickel layer.

According to an embodiment of the invention, the manufacturing method of the circuit structure further includes providing an insulation layer on a lower surface of the metal layer when the metal layer is provided. The lower surface is opposite to the upper surface.

In an embodiment of the invention, a circuit structure that includes a metal layer, a surface passivation layer, and a covering layer is provided. The metal layer has an upper surface. The surface passivation layer is configured on the upper surface of the metal layer. Here, the surface passivation layer exposes a portion of the upper surface of the metal layer, and a material of the metal layer is different from a material of the surface passivation layer. The covering layer is located on the surface passivation layer and covers the surface passivation layer.

According to an embodiment of the invention, the covering layer covers a portion of the surface passivation layer, and a material of the covering layer includes an organic material.

According to an embodiment of the invention, the organic material includes mercaptan nano-polymer or hydroxypropyl-beta-cyclodextrin.

According to an embodiment of the invention, a material of the covering layer includes a photoresist material.

According to an embodiment of the invention, the photoresist material includes dry film photoresist or liquid photoresist.

According to an embodiment of the invention, a material of the metal layer includes copper or copper alloy.

According to an embodiment of the invention, the surface passivation layer includes a nickel layer and a gold layer. The nickel layer is located between the metal layer and the gold layer, and the gold layer covers the nickel layer.

According to an embodiment of the invention, the surface passivation layer includes a nickel layer, a palladium layer, and a gold layer. The nickel layer is located between the metal layer and the palladium layer, and the gold layer covers the palladium layer.

According to an embodiment of the invention, the surface passivation layer includes a nickel layer and a silver layer. The nickel layer is located between the metal layer and the silver layer, and the silver layer covers the nickel layer.

According to an embodiment of the invention, the circuit structure further includes an insulation layer that is configured on a lower surface of the metal layer. The lower surface is opposite to the upper surface.

Based on the above, in the manufacturing method of the circuit structure described in the embodiments of the invention, it is likely to form the covering layer that can be spontaneously attached to the surface passivation layer through chemical or physical absorption. Alternatively, the covering layer covering the surface passivation layer may be formed through photoresist coverage or photoresist coating, exposure, and development. Further, the Galvanic effects caused by the potential difference between two kinds of metals can be prevented when the subsequent processes are performed. Namely, the anode having the relatively high potential is dissolved in an accelerated manner. Accordingly, the circuit structure described in the embodiments of the invention can have favorable electrical quality.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4A to FIG. 4C are cross-sectional views illustrating several steps in a manufacturing method of a circuit structure according to another embodiment of the invention.

DETAILED DESCRIPTION OF DISCLOSED EXEMPLARY EMBODIMENTS

Figure 1A:
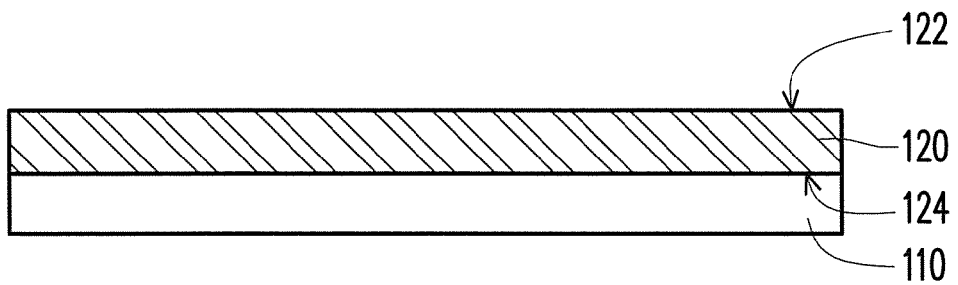
FIG. 1A to FIG. 1C are cross-sectional views illustrating a manufacturing method of a circuit structure according to an embodiment of the invention.
Figure 1B:
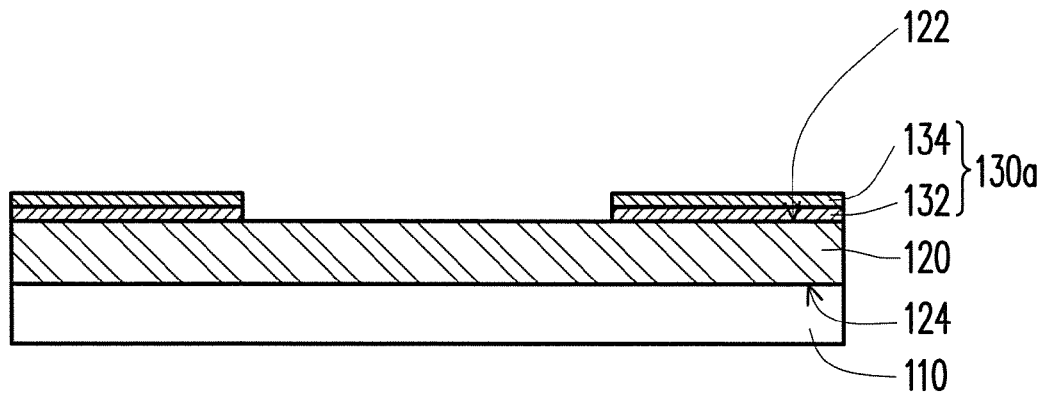
Figure 1C:
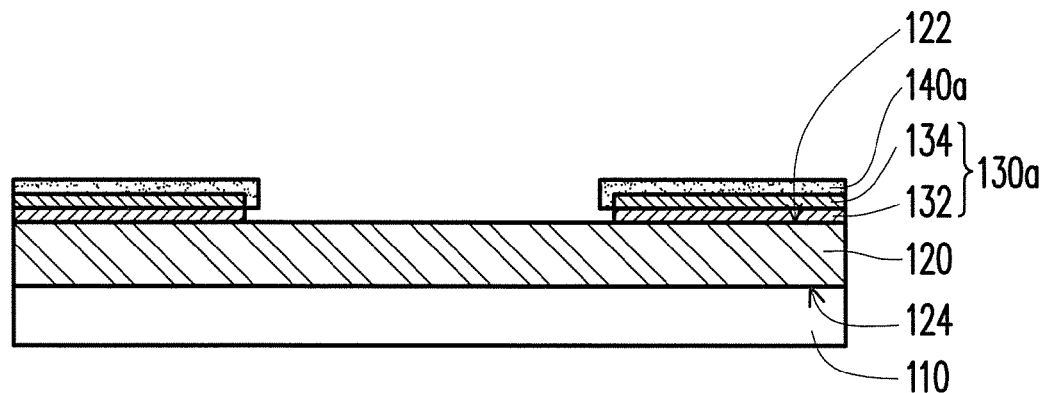

FIG. 1A to FIG. 1C are cross-sectional views illustrating a manufacturing method of a circuit structure according to an embodiment of the invention. With reference to FIG. 1A, in the manufacturing method of the circuit structure of this embodiment, an insulation layer 110 and a metal layer 120 are provided. The metal layer 120 has an upper surface 122 and a lower surface 124 opposite to the upper surface 122. The insulation layer 110 is configured on the lower surface 124 of the metal layer 120, so as to support the metal layer 120. According to this embodiment, the metal layer 120 is made of copper or copper alloy, for instance.

With reference to FIG. 1B, a surface passivation layer 130a is formed on the metal layer 120. The surface passivation layer 130a exposes a portion of the upper surface 122 of the metal layer 120, and a material of the metal layer 120 is different from a material of the surface passivation layer 130a. The surface passivation layer 130a of this embodiment is constituted by a nickel layer 132 and a gold layer 134, for instance. The nickel layer 132 is located between the metal layer 120 and the gold layer 134, and the gold layer 134 covers the nickel layer 132. Besides, note that a method of forming the surface passivation layer 130a includes electroplating or chemical electroplating.

With reference to FIG. 1C, a covering layer 140a is formed on the surface passivation layer 130a, and the covering layer 140a covers the surface passivation layer 130a. Specifically, in the present embodiment, the metal layer 120 and the surface passivation layer 130a are dipped into a modifier (not shown), and the modifier is selectively attached to gold layer 134 of the surface passivation layer 130a through chemical or physical absorption, so as to form a covering layer 140a. Hence, the covering layer 140a covers a portion of the surface passivation layer 130a. The covering layer 140a closely covers the gold layer 134. The covering layer 140a may have a plurality of nanoparticles according to other embodiments that are not depicted in the drawings. In this embodiment, a thickness of the covering layer 140a is less than 100 nm, for instance, and the covering layer 140a is made of an organic material, such as mercaptan nano-polymer, hydroxypropyl-beta-cyclodextrin, and so on. So far, fabrication of the circuit structure 100a is substantially completed.

As indicated in FIG. 1C, the circuit structure 100a includes the insulation layer 110, the metal layer 120, the surface passivation layer 130a, and the covering layer 140a. The metal layer 120 has the upper surface 122 and the lower surface 124 opposite to the upper surface 122. The insulation layer 110 is configured on the lower surface 124 of the metal layer 120, so as to support the metal layer 120. The surface passivation layer 130a is configured on the upper surface 122 of the metal layer 120. Here, the surface passivation layer 130a exposes a portion of the upper surface 122 of the metal layer 120, and a material of the metal layer 120 is different from a material of the surface passivation layer 130a. The covering layer 140a is located on the surface passivation layer 130a and covers the surface passivation layer 130a.

It should be mentioned that the surface passivation layer 130a of this embodiment is constituted by the nickel layer 132 and the gold layer 134, for instance. The nickel layer 132 is located between the metal layer 120 and the gold layer 134, and the gold layer 134 covers the nickel layer 132. Nevertheless, the invention should not be construed as limited to the embodiments set forth herein.

Other embodiments are given for illustration below. In the previous and following embodiments, same reference numbers are used to represent same or similar elements, and repetitive explanation is omitted. For a detailed description of this section, reference can be found in the previous embodiment of the invention; therefore, no further explanation is provided in the following embodiments.

Figure 2:
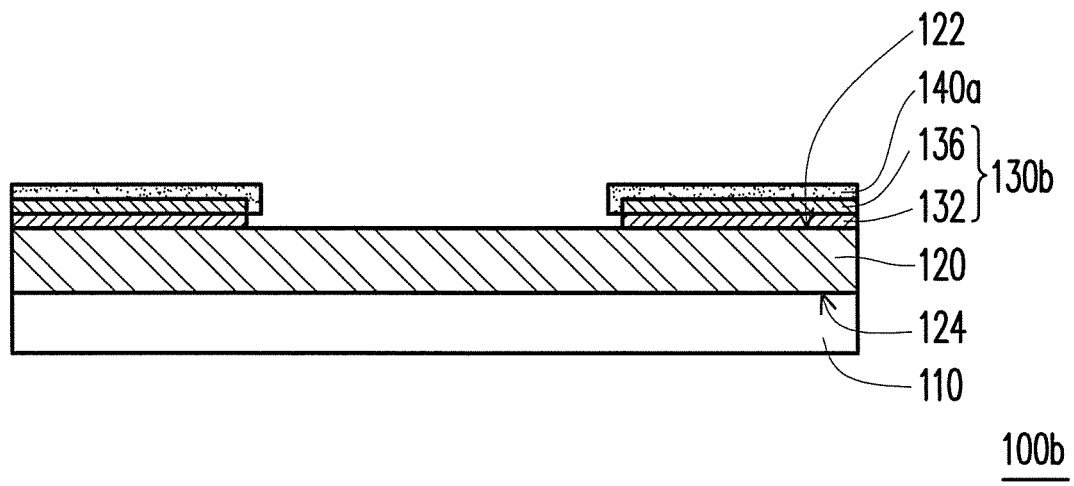
FIG. 2 is a schematic cross-sectional view illustrating a circuit structure according to another embodiment of the invention.

FIG. 2 is a schematic cross-sectional view illustrating a circuit structure according to another embodiment of the invention. With reference to FIG. 2, the circuit structure 100b of the present embodiment is similar to the circuit structure 100a depicted in FIG. 1C, while the main difference therebetween lies in that the surface passivation layer 130b of the circuit structure 100b is constituted by a nickel layer 132 and a silver layer 136. The nickel layer 132 is located between the metal layer 120 and the silver layer 136, and the silver layer 136 covers the nickel layer 132. The covering layer 140a closely covers the silver layer 136.

Figure 3:
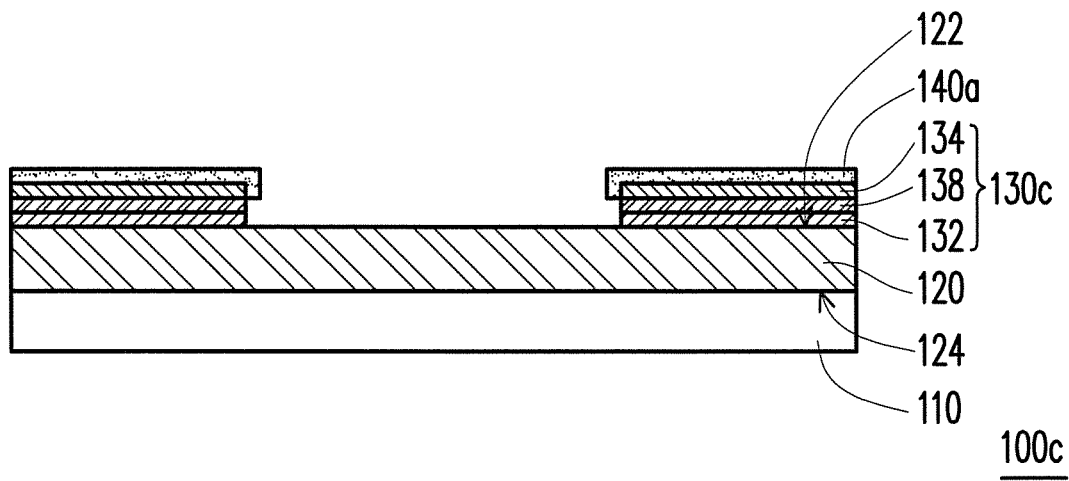
FIG. 3 is a schematic cross-sectional view illustrating a circuit structure according to another embodiment of the invention.

FIG. 3 is a schematic cross-sectional view illustrating a circuit structure according to another embodiment of the invention. With reference to FIG. 3, the circuit structure 100c of the present embodiment is similar to the circuit structure 100a depicted in FIG. 1C, while the main difference therebetween lies in that the surface passivation layer 130c of the circuit structure 100c is constituted by a nickel layer 132, a palladium layer 138, and a gold layer 134. The nickel layer 132 is located between the metal layer 120 and the palladium layer 138, and the gold layer 134 covers the palladium layer 138. The covering layer 140a closely covers the gold layer 134.

That is to say, the surface passivation layers 130a, 130b, and 130c herein are exemplary and should not be construed as limitations to the invention. As long as the surface passivation layers 130a, 130b, and 130c each contain a metal layer made of noble metal, the surface passivation layers 130a, 130b, and 130 do not depart from the scope of the invention for which protection is sought.

The redox potential of the metal layer 120 made of copper or copper alloy is different from the redox potential of the gold layer 134 or the silver layer 136 in the surface passivation layer 130a, 130b, or 130c, and therefore the potential difference between the two kinds of metals is likely to result in Galvanic effects in the subsequent processes. In the present embodiment, the metal layer 120 and the surface passivation layers 130a, 130b, and 130c are dipped into the modifier to form the covering layer 140a that can be spontaneously attached to the surface passivation layers 130a, 130b, and 130c through chemical or physical absorption. Thereby, the physical characteristics (e.g., hydrophobicity/hydrophilicity or the liquid contacting angle) of the surface of the surface passivation layers 130a, 130b, and 130c can be changed. Accordingly, the chip structures 100a, 100b, and 100c can be effectively protected from being affected by the Galvanic effects in the subsequent processes.

Figure 4A:
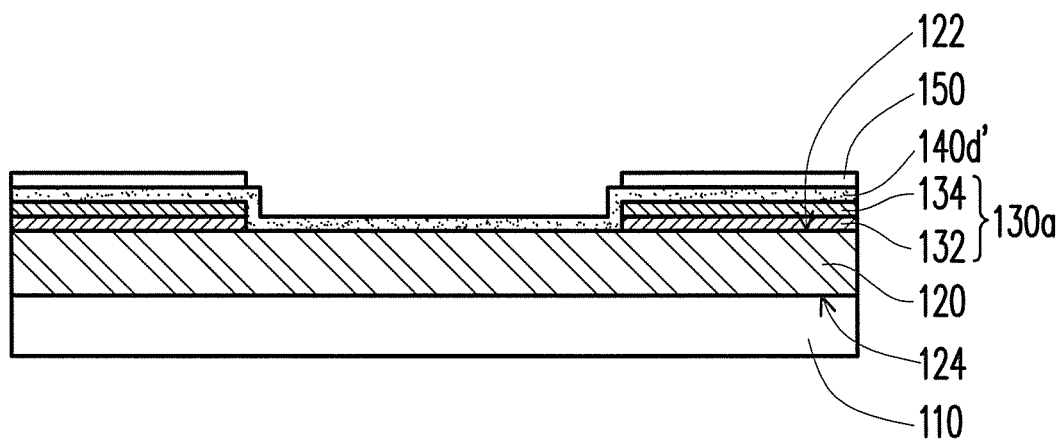
Figure 4B:
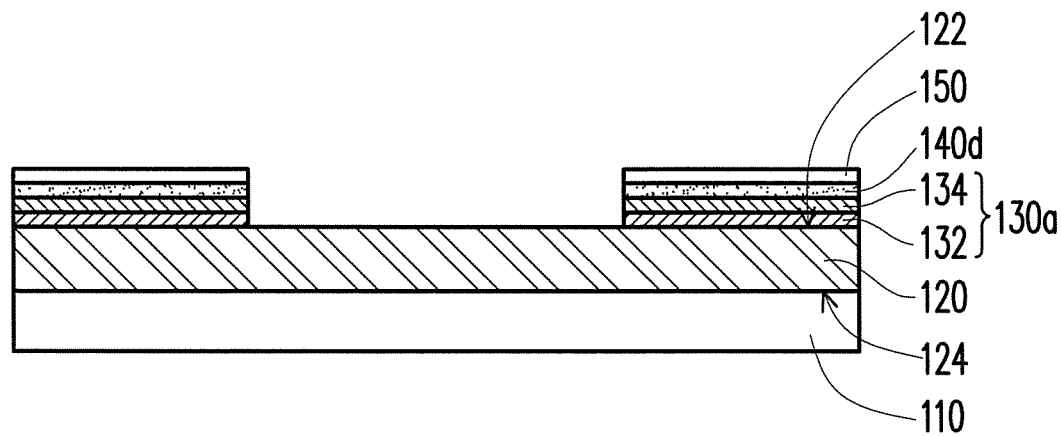

FIG. 4A to FIG. 4C are cross-sectional views illustrating several steps in a manufacturing method of a circuit structure according to another embodiment of the invention. The manufacturing method of the package circuit structure 100d in the present embodiment is similar to that of the circuit structure 100a depicted in FIG. 1C, while the main difference therebetween lies in that dry film photoresist is employed in the circuit structure 100d of the present embodiment, so as to form a covering layer 140d through exposure and development.

In particular, after the step shown in FIG. 1B is performed, i.e., after the surface passivation layer 130a is formed, a covering material layer 140d' is formed on both the surface passivation layer 130a and the portion of the upper surface 122 of the metal layer 120 exposed by the surface passivation layer 130a, as indicated in FIG. 4A. The covering material layer 140d' is made of dry film photoresist, for instance. A photomask 150 is then provided on the covering material layer 140d', and the photomask 150 is disposed corresponding to the surface passivation layer 130a. In other words, the orthogonal projection area of the photomask 150 on the metal layer 120 is completely overlapped with the orthogonal projection area of the surface passivation layer 130a on the metal layer 120.

With reference to FIG. 4B, an exposure process and a development process are performed on the covering material layer 140d' through the photomask 150, so as to form the covering layer 140d. To be more specific, the photomask 150 is disposed corresponding to the surface passivation layer 130a. Hence, after the exposure process and the development process are completed, the covering layer 140d is disposed on the metal layer 134 of the surface passivation layer 130a, and the covering layer 140d and the surface passivation layer 130a are conformally disposed. The photomask 150 is then removed to expose the covering layer 140d, as indicated in FIG. 4C. So far, fabrication of the circuit structure 100d is substantially completed.

As indicated in FIG. 4C, the circuit structure 100d includes the insulation layer 110, the metal layer 120, the surface passivation layer 130a, and the covering layer 140d. The metal layer 120 has the upper surface 122 and the lower surface 124 opposite to the upper surface 122. The insulation layer 110 is configured on the lower surface 124 of the metal layer 120, so as to support the metal layer 120. The surface passivation layer 130a is configured on the upper surface 122 of the metal layer 120. Here, the surface passivation layer 130a exposes a portion of the upper surface 122 of the metal layer 120, and a material of the metal layer 120 is different from a material of the surface passivation layer 130a. The covering layer 140d is located on the surface passivation layer 130a and covers the surface passivation layer 130a. Besides, the covering layer 140d and the surface passivation layer 130a are conformally disposed.

Figure 5A:
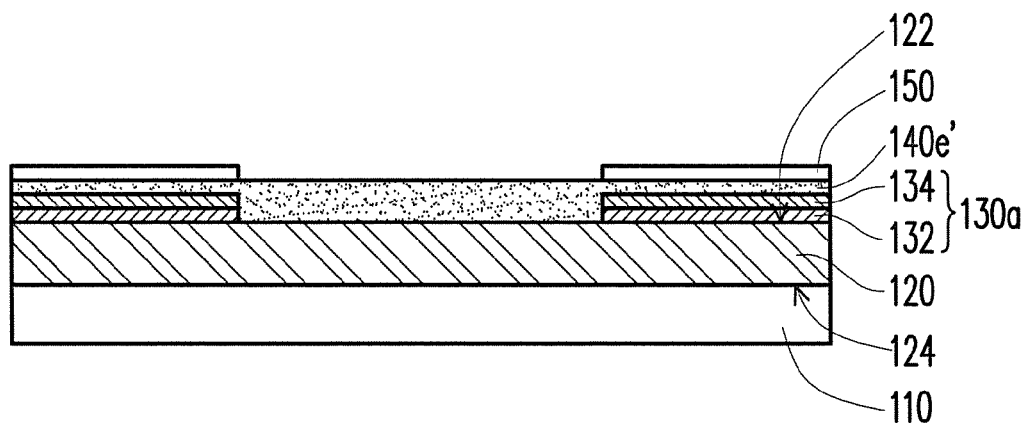
FIG. 5A to FIG. 5C are cross-sectional views illustrating several steps in a manufacturing method of a circuit structure according to still another embodiment of the invention.
Figure 5B:
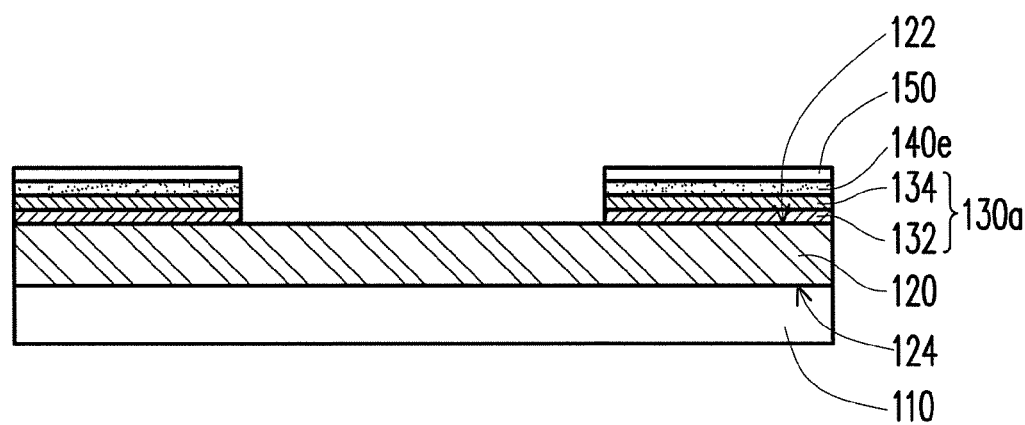
Figure 5C:
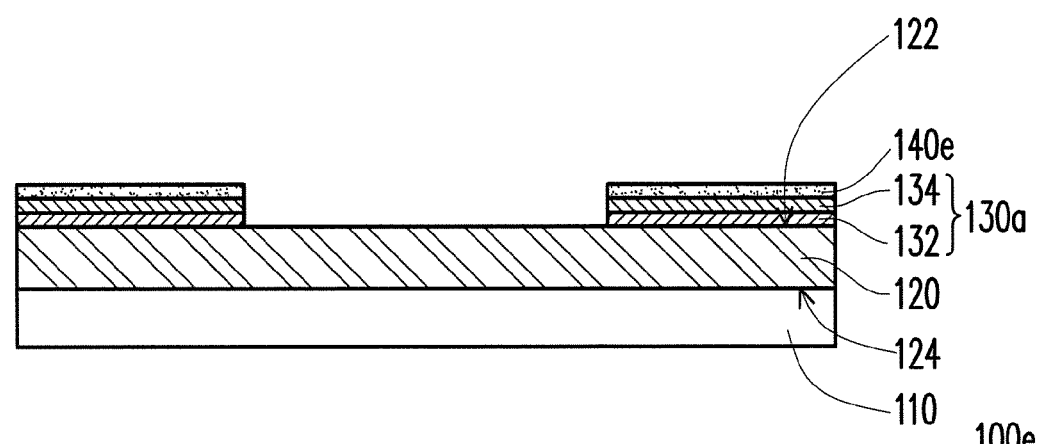

FIG. 5A to FIG. 5C are cross-sectional views illustrating several steps in a manufacturing method of a circuit structure according to still another embodiment of the invention. The manufacturing method of the package circuit structure 100e in the present embodiment is similar to that of the circuit structure 100a depicted in FIG. 1C, while the main difference therebetween lies in that liquid photoresist is employed in the circuit structure 100e of the present embodiment, so as to form a covering layer 140e through exposure and development.

In particular, after the step shown in FIG. 1B is performed, i.e., after the surface passivation layer 130a is formed, a covering material layer 140e' is formed on both the surface passivation layer 130a and the portion of the upper surface 122 of the metal layer 120 exposed by the surface passivation layer 130a, as indicated in FIG. 5A. The covering material layer 140e' is made of liquid photoresist, for instance. A photomask 150 is then provided on the covering material layer 140e', and the photomask 150 is disposed corresponding to the surface passivation layer 130a. In other words, the orthogonal projection area of the photomask 150 on the metal layer 120 is completely overlapped with the orthogonal projection area of the surface passivation layer 130a on the metal layer 120.

With reference to FIG. 5B, an exposure process and a development process are performed on the covering material layer 140e' through the photomask 150, so as to form the covering layer 140e. To be more specific, the photomask 150 is disposed corresponding to the surface passivation layer 130a. Hence, after the exposure process and the development process are completed, the covering layer 140e is disposed on the metal layer 134 of the surface passivation layer 130a, and the covering layer 140e and the surface passivation layer 130a are conformally disposed. Furthermore, a thickness of the covering layer 140e is less than 100 nm, for instance. The photomask 150 is then removed to expose the covering layer 140e, as indicated in FIG. 5C. So far, fabrication of the circuit structure 100e is substantially completed.

As indicated in FIG. 5C, the circuit structure 100e includes the insulation layer 110, the metal layer 120, the surface passivation layer 130a, and the covering layer 140e. The metal layer 120 has the upper surface 122 and the lower surface 124 opposite to the upper surface 122. The insulation layer 110 is configured on the lower surface 124 of the metal layer 120, so as to support the metal layer 120. The surface passivation layer 130a is configured on the upper surface 122 of the metal layer 120. Here, the surface passivation layer 130a exposes a portion of the upper surface 122 of the metal layer 120, and a material of the metal layer 120 is different from a material of the surface passivation layer 130a. The covering layer 140e is located on the surface passivation layer 130a and covers the surface passivation layer 130a.

It should be mentioned that the surface passivation layer 130a of the embodiments shown in FIG. 4C and FIG. 5C is constituted by the nickel layer 132 and the gold layer 134, for instance. The nickel layer 132 is located between the metal layer 120 and the gold layer 134, and the gold layer 134 covers the nickel layer 132. However, in other embodiments that are not shown in the drawings, the surface passivation layer 130b or 130c respectively described in the embodiment shown in FIG. 2 or FIG. 3 is applicable. The surface passivation layer 130b is constituted by the nickel layer 132 and the silver layer 136. The nickel layer 132 is located between the metal layer 120 and the silver layer 136, and the silver layer 136 covers the nickel layer 132. The surface passivation layer 130c is constituted by the nickel layer 132, the palladium layer 138, and the gold layer 134. The nickel layer 132 is located between the metal layer 120 and the palladium layer 138, and the gold layer 134 covers the palladium layer 138. With reference to the descriptions in the previous embodiments, people having ordinary skill in the art should be able to select proper components described above to achieve desirable technical effects based on actual demands.

It should be mentioned that each of the circuit structures 100a, 100b, 100c, 100d, and 100e may be a single-side circuit board, a layer of circuit structure in a double-side circuit board, or a layer of circuit structure in a multi-layer circuit board. Here, the layer of circuit structure may be a surface circuit structure or an inner circuit structure, for instance. As such, based on the embodiments of the invention, the manufacturing method of the circuit structure can be applied to the process of fabricating the single-side circuit board, the double-side circuit board, or the multi-layer circuit board.

To sum up, by applying the manufacturing method of the circuit structure described in the embodiments of the invention, it is likely to foam the covering layer that can be spontaneously attached to the surface passivation layer through chemical or physical absorption. Alternatively, the covering layer covering the surface passivation layer may be formed through photoresist coverage or photoresist coating, exposure, and development. Further, the Galvanic effects caused by the potential difference between two kinds of metals can be prevented when the subsequent processes are performed. Accordingly, the circuit structure described in the embodiments of the invention can have favorable electrical quality.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of a circuit structure, comprising:
   providing a metal layer, the metal layer having an upper surface;
   forming a surface passivation layer on the upper surface of the metal layer, the surface passivation layer exposing a portion of the upper surface of the metal layer, a material of the metal layer being different from a material of the surface passivation layer; and
   dipping the metal layer and the surface passivation layer into a modifier, the modifier being selectively attached to the surface passivation layer through absorption to form a covering layer, the covering layer covering a portion of the surface passivation layer, wherein a material of the covering layer comprises an organic material, and the organic material comprises mercaptan nano-polymer or hydroxypropyl-beta-cyclodextrin.

2. The manufacturing method as recited in claim 1, wherein a material of the metal layer comprises copper or copper alloy.

3. The manufacturing method as recited in claim 1, wherein the surface passivation layer comprises a nickel layer and a gold layer, the nickel layer is located between the metal layer and the gold layer, and the gold layer covers the nickel layer.

4. The manufacturing method as recited in claim 1, wherein the surface passivation layer comprises a nickel layer, a palladium layer, and a gold layer, the nickel layer is located between the metal layer and the palladium layer, and the gold layer covers the palladium layer.

5. The manufacturing method as recited in claim 1, wherein the surface passivation layer comprises a nickel layer and a silver layer, the nickel layer is located between the metal layer and the silver layer, and the silver layer covers the nickel layer.

6. The manufacturing method as recited in claim 1, further comprising:
   providing an insulation layer on a lower surface of the metal layer when the metal layer is provided, the lower surface being opposite to the upper surface.

* * * * *